United States Patent [19]

Harwood et al.

[11] Patent Number: 4,626,894

[45] Date of Patent: Dec. 2, 1986

[54] SIGNAL FILTERING SYSTEM HAVING ADAPTIVELY CASCADED FILTER STAGES FOR DEVELOPING A VARIABLE BANDWIDTH FREQUENCY CHARACTERISTIC

[75] Inventors: Leopold A. Harwood, Bridgewater; Robert A. Wargo, Ringoes, both of N.J.

[73] Assignee: RCA Corporation, Princeton, N.J.

[21] Appl. No.: 657,592

[22] Filed: Oct. 4, 1984

[51] Int. Cl.$^4$ .............................................. H04N 9/78
[52] U.S. Cl. ........................................ 358/31; 358/36
[58] Field of Search .................... 358/31, 36, 37, 166, 358/167

[56] References Cited

U.S. PATENT DOCUMENTS

| | | | |
|---|---|---|---|
| 3,242,259 | 3/1966 | Keiper, Jr. | 178/5.4 |
| 4,097,897 | 6/1978 | Morris | 358/162 |
| 4,149,181 | 4/1979 | Burdick et al. | 358/31 |
| 4,167,021 | 9/1979 | Holmes | 358/31 |
| 4,218,700 | 8/1980 | Kashigi | 358/31 |
| 4,237,476 | 12/1980 | Hanma et al. | 358/38 |
| 4,241,363 | 12/1980 | Maeyama et al. | 358/36 |
| 4,268,855 | 5/1981 | Takahashi | 358/36 |
| 4,288,872 | 9/1981 | Tamburelli | 375/14 |
| 4,328,465 | 5/1982 | Takaoka et al. | 330/151 |
| 4,383,304 | 5/1983 | Hirashima | 364/715 |
| 4,389,665 | 6/1983 | Nagao et al. | 358/37 |
| 4,415,918 | 11/1983 | Lewis, Jr. | 358/23 |
| 4,443,817 | 4/1984 | Faroudja | 358/167 |

FOREIGN PATENT DOCUMENTS

| | | | |
|---|---|---|---|
| 123292 | 7/1983 | Japan | 358/36 |
| 0129892 | 8/1983 | Japan | 358/31 |
| 2016239 | 9/1979 | United Kingdom | 358/31 |
| 2127250A | 4/1984 | United Kingdom | |

OTHER PUBLICATIONS

Bipolar Microprocessor Logic and Interface Data Book (Advanced Microdevices), 1983 Advanced Micro Devices, Inc., pp. 7-25, 7-27.

Primary Examiner—John W. Shepperd
Attorney, Agent, or Firm—E. M. Whitacre; P. J. Rasmussen; K. N. Nigon

[57] ABSTRACT

An adaptive filtering system is disclosed. The system is used in a digital television receiver to extract low frequency vertical detail information from a comb filtered chrominance signal. This system provides wide bandwidth vertical detail information when the amplitude of the chrominance component of the composite video signal is low and narrower bandwidth vertical detail signals as the amplitude of the chrominance component increases. Adaptive filtering is accomplished by passing the comb filtered chrominance signal through a first low-pass filter, developing two reduced amplitude replicas of the filtered signal which are mutually supplementary. The ratio of the amplitudes of these two replicas is variable with a control signal. One replica is passed through a second low-pass filter and combined with the other replica to produce a vertical detail signal. The embodiment of the system that is disclosed includes means for developing a control signal that is proportional to the instantaneous amplitude of the chrominance component of the composite video signal.

14 Claims, 4 Drawing Figures

SIGNAL FILTERING SYSTEM HAVING ADAPTIVELY CASCADED FILTER STAGES FOR DEVELOPING A VARIABLE BANDWIDTH FREQUENCY CHARACTERISTIC

The present invention relates generally to electronic signal processing filters and particularly to filters having variable bandwidth frequency characteristics.

Electronic signal processing filters may be used to remove the noise components from an information signal, to separate the low and high frequency components of a composite signal, or generally to recover the information contained in one frequency band of a signal without interference from components in other frequency bands.

Problems are often encountered when the frequency spectrum of an interfering signal component is adjacent to or overlaps the frequency spectrum of the signal to be recovered. For these complete signals, an expensive filter, having steep roll-off regions in its frequency characteristic, may be used to recover the desired signal components with minimal interference from components occupying adjacent frequency bands.

Less expensive filters, having less steep roll-off regions, may be used to filter these composite signals, but the full bandwidth of the desired signals may be obtained only if relatively high levels of interference can be tolerated in the recovered signal.

The NTSC composite video signal is an example of a signal having component signals with overlapping frequency spectra. The luminance and chrominance components of an NTSC composite video signal are disposed in a frequency interleaved relation. The luminance components are generally at integral multiples of a horizontal line scanning frequency ($f_h$) and chrominance components at odd multiples of one-half of the line scanning frequency ($\frac{1}{2}f_h$). The luminance components occupy a frequency spectrum which ranges from 0 Hz to approximately 4.2 MHz and the chrominance components occupy a band of frequencies ranging from approximately 2.4 MHz to 4.2 MHz.

Comb filter arrangements are known which separate the frequency interleaved luminance and chrominance components of the video signal. Where a comb filter is employed, however, reproduction of a color image tends to be impaired in the presence of relatively low frequency luminance signal components in the combed chrominance signal. These luminance signals, which, for example, may be produced for an image containing diagonal lines, reduce the vertical resolution and distort the colors of the reproduced image.

To correct these problems, conventional television receivers apply the combed chrominance signal to a low pass filter which may, for example, have a pass band from 0 to 1 MHz. The signal provided by this filter is added to the combed luminance signal and subtracted from the combed chrominance signal. This process restores the low frequency components to the luminance signals, increasing the vertical resolution of the image, and removes the contaminating components from the chrominance signals, reducing the color distortion.

Since the luminance signals have a broad frequency spectrum it is desirable to recover as much of the luminance signal as possible from the combed chrominance signals. Accordingly, it is desirable to use a wide bandwidth low pass filter to recover the vertical detail information. When this is done, however, spurious dots may appear in the areas of the image which contain relatively saturated colors. These dots are cross-color interference produced by chrominance signals that have sufficient amplitude to pass through the low pass filter. Consequently, vertical detail low pass filters for color television receivers generally are designed to have a compromised bandwidth, providing as much increased vertical resolution as can be achieved without introducing cross-color interference.

The embodiment of the invention described below is an adaptive low pass filter which has a pass band that becomes wider or narrower respectively in response to decreased or increased levels of chrominance in the input signals.

SUMMARY OF THE INVENTION

The present invention is an adaptive filter system including two filters, a signal splitter and a signal combiner. The passband of the first filter is substantially equal in width to the predetermined maximum bandwidth of the adaptive filter system. The signal splitter is coupled to the output port of the first filter. It produces two mutually supplementary output signals, each being a reduced amplitude replica of the signal provided by the first filter. The splitter has a control signal input for changing the relative amplitude levels of the signals at its two output ports. The second filter is coupled to one of these output ports to reduce the bandwidth of the signal provided thereby. The signal combiner is coupled to the other one of the output ports of the signal splitter and to the output port of the second filter. It combines the signals provided by these devices to produce the output signal of the filtering system. The frequency characteristics of this filtering system has a pass-band which may vary in width between the bandwidth of the first filter and the bandwidth of the cascade combination of the first and second filters. The bandwidth of the filter system varies as a function of the control signal applied to the signal splitter.

DETAILED DESCRIPTION

Figure 1:
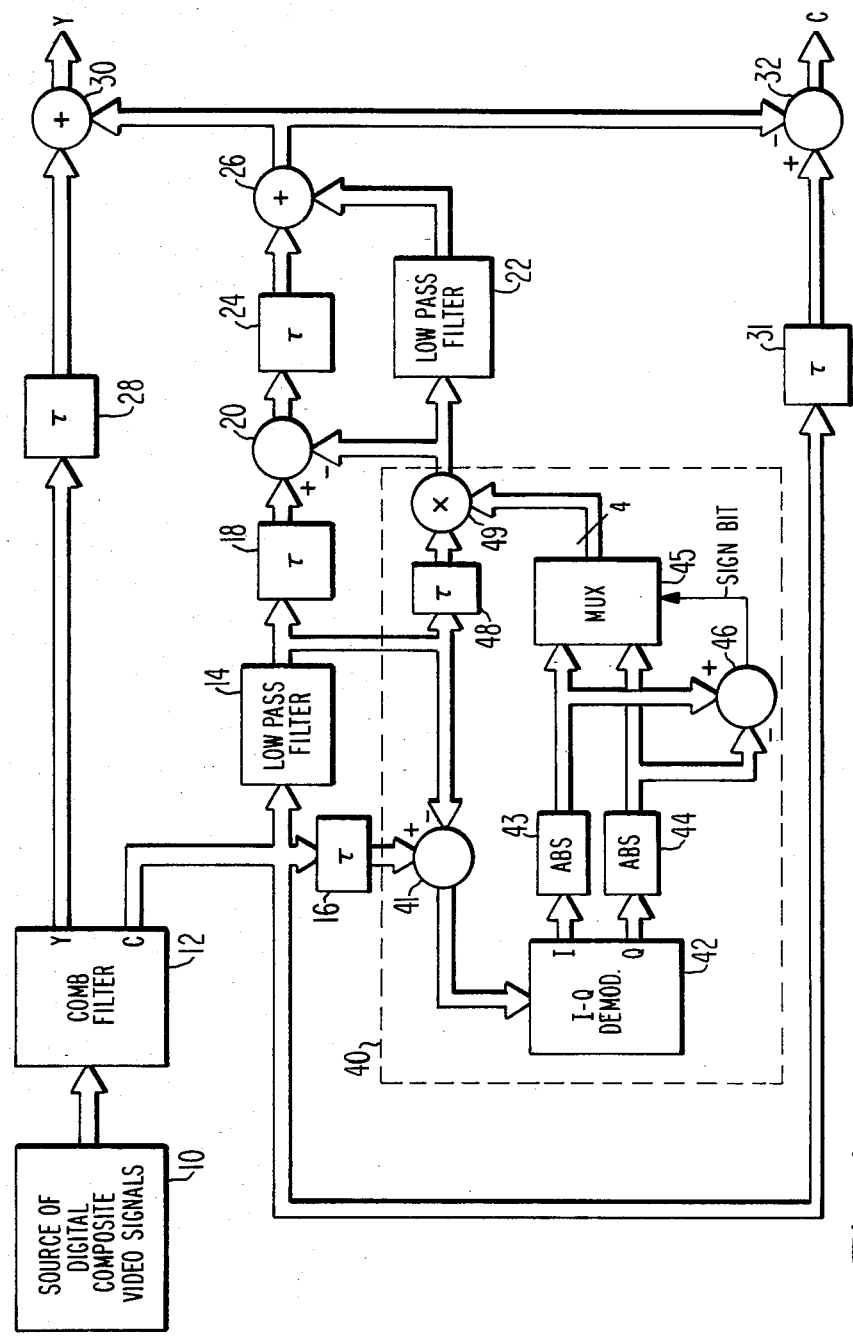
FIG. 1 is a block diagram of an embodiment of the invention in the context of the vertical detail restoration circuitry of a digital color television receiver.

In the drawings, broad arrows represent busses for multiple-bit parallel digital sigals. These busses carry eight-bit signals unless otherwise indicated by a slash across the bus and an adjacent number. Line arrows represent connections carrying analog signals or single-bit digital signals. A small circle at the input terminal of a logic element indicates that the element responds to the logical complement of that input signal.

Figure 3:
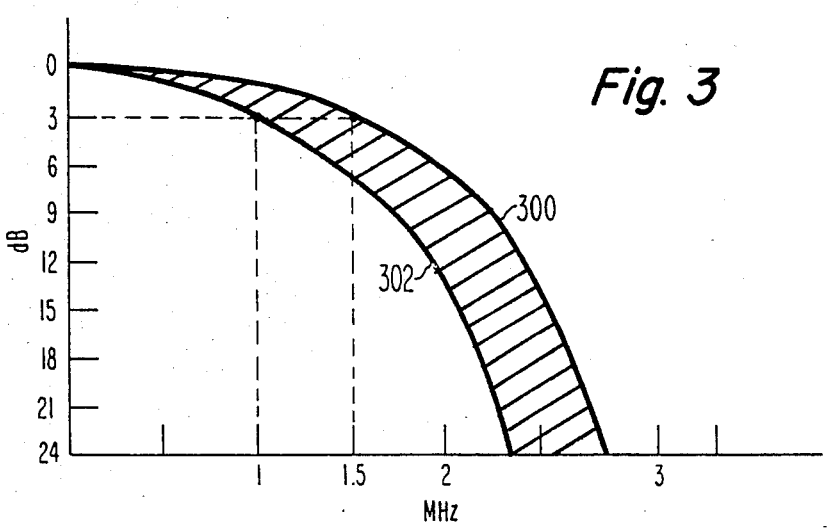
FIG. 3 is a graph of amplitude versus frequency which illustrates the possible frequency characteristics of the filter system shown in FIG. 1.

In FIG. 1, digital samples representing composite video signals are provided to comb filter 12 by a source of composite video signals 10. Source 10 may be, for example, the analog to digital (A/D) converter of a conventional digital television receiver. Comb filter 12 provides a digital combed luminance signal at its output port Y and a digital combed chrominance signal at its output port C. The chrominance signal is composed of two quadrature phase related color difference signals, I and Q. When the samples are provided by the A/D converter at a rate equal to four times the color subcarrier frequency ($4f_{sc}$) the chrominance signal provided by the comb filter may be represented as alternating samples of these color difference signals (i.e. +I, +Q, −I, −Q, +I, etc.) where the plus and minus signs indicate sampling phase, not sample polarity. These combed chrominance samples from filter 12 are applied to low pass filter 14. The frequency characteristic of the low pass filter 14 used in this embodiment of the invention is shown by curve 300 of FIG. 3. This filter has a passband from 0 to 1.5 MHz. Samples passed by filter 14 represent luminance vertical detail information which has been extracted from the combed chrominance signal. Because of the relatively wide bandwidth and gentle roll-off of filter 14, these samples may also include a portion of the chrominance signals occupying the frequency band from 2.4 to 4 MHz.

Samples from low pass filter 14 are applied to delay element 48. The delayed samples from delay element 48 are applied as the multiplicand input signal to sample scaler 49. The multiplier input signal to scaler 49 is an attenuating factor provided by multiplexer 45. Sample scaler 49, which may be, for example, a conventional 16 bit digital multiplier such as the AM29516 manufactured by Advanced Micro devices, Inc., provides samples that are attenuated replicas of the samples applied to its multiplicand input port. Delay element 48 provides compensating delay for the multiplicand samples from filter 14 while the value of the attenuation factor for the samples is determined.

Attenuation network 40, which includes delay element 48, sample scaler 49, and the circuitry to generate the attenuation factors, is described in detail below.

The samples provided by sample scaler 49 are applied to low pass filter 22. In the present embodiment, filter 22 is identical to low pass filter 14. The samples that are available at the output terminal of filter 22 have the frequency spectrum of signals that have been filtered by the cascade combination of filters 14 and 22. In the present embodiment, since both filters 14 and 22 have frequency characteristics similar to curve 300 of FIG. 3, it can be shown that the cascade combination of filters 14 and 22 has a frequency characteristic similar to curve 302. It is noted that the bandwidth of the characteristic represented by curve 302 is approximately 1 MHz and that signals having frequencies greater than 2.4 MHz are attenuated by more than 24 dB. The signals passed by the combination of filters 14 and 22, therefore, have less vertical detail information and less chrominance interference than the signals provided by filter 14 alone.

Samples from low-pass filter 14 via delay element 18 is applied to the minuend input port, and samples from sample scaler 49 are applied to the subtrahend input port of subtracter 20. Subtracter 20 and sample scaler 49 constitute signal splitting circuitry which provides samples that are mutually supplementary at the output ports of the sample scaler 49 and the subtracter 20 respectively are represented by $\alpha X$, $\alpha$ being the attenuation factor, then the samples available at the output of subtracter 20 may be represented as $(1-\alpha)X$. The time delay provided by delay element 18 compensates for the processing time through delay element 48 and sample scaler 49.

The samples provided by subtracter 20 are delayed by delay element 24 and applied to an input port of adder 26. Delay element 24 provides compensating delay equal to the processing delay through low pass filter 22. Samples from low-pass filter 22 are applied to the other input port of adder 26. Adder 26 produces samples representing the sum of a doubly filtered and attenuated signal and its singly filtered supplementary signal. The proportion of singly filtered signal to doubly filtered signal is determined by the level of attenuation applied by sample scaler 49. When the attenuation factor is close to unity the filter system appears as a cascade combination of low pass filters 14 and 22. The frequency characteristic of the filtering system in this state is shown by curve 302. When the attenuation factor approaches zero, however, the filtering system appears as filter 14 only, and has the frequency characteristic shown by curve 300. For attenuation factors between zero and unity the frequency characteristic of the filter lies within the shaded region between curves 300 and 302.

Consequently, it is attenuation network 40 that controls the bandwidth of the filtering system. In network 40, low pass filtered combed chrominance samples from filter 14 are applied to the subtrahend input port of subtracter 41 and unfiltered combed chrominance signals, from comb filter 12 are applied to the minuend input via delay element 16. Delay element 16 delays the combed chrominance samples by an amount of time equal to the processing time of filter 14. Subtracter 41 removes the low frequency components from the combed chrominance signals and effectively provides high pass filtered chrominance signals to I-Q demodulator 42. Demodulator 42 may be a conventional color difference signal demodulator such as the one described in U.S. Pat. No. 4,415,918 entitled "Digital Color Television Signal Demodulator". This demodulator may include a demultiplexer for separating the $4f_{sc}$ combed chrominance samples into separate sequences of I and Q color difference signal samples that have a $2f_{sc}$ rate (i.e. changing the sequence +I, +Q, −I, −Q, +I ... into the two sequences +I, −I, +I ... and +Q, −Q, +Q ...). The demodulator may include further circuitry to remove the color carrier from the I and Q sequences. The samples provided by the demodulator, therefore, represent baseband I and Q color difference signals.

The I and Q samples from demodulator 42 are applied to absolute value circuits 43 and 44 respectively which pass samples representing the magnitudes of the I and Q samples to the two data inputs of multiplexer 45. I signal magnitude samples from absolute value circuit 43 are applied to the minuend input port, and Q signal magnitude samples from absolute value circuit 44 are applied to the subtrahend input port of subtracter 46. The sign bit output signal of subtracter 46 is in a logic high state (i.e. indicating a negative result) when the Q sample has a greater magnitude than the I sample and is in a logic low state otherwise. This signal controls multiplexer 45 to pass the four most significant bits of the greater of the two samples applied to its input ports. These four-bit samples are the attenuation factors that are applied to the multiplier input port of sample scaler 49.

It is contemplated that a low-pass filter may be inserted between the multiplexer 45 and the sample scaler 49. A filtering system which includes a filter of this type may be preferred when signals having a low signal to noise ratio are to be filtered.

As described above, sample scaler 49 is a 16 bit parallel multiplier. In the present embodiment, the eight-bit samples from delay element 48 are applied as the eight most significant bits of the multiplicand input signal and the four bit samples from multiplexer 45 are applied as the four more significant bits of the eight least significant bits of the multiplier input signal. The output samples are available on lines 8 through 15 of the output bus where the lines that make up the output bus are numbered from 0 (least significant) to 31 (most significant).

Figure 2:
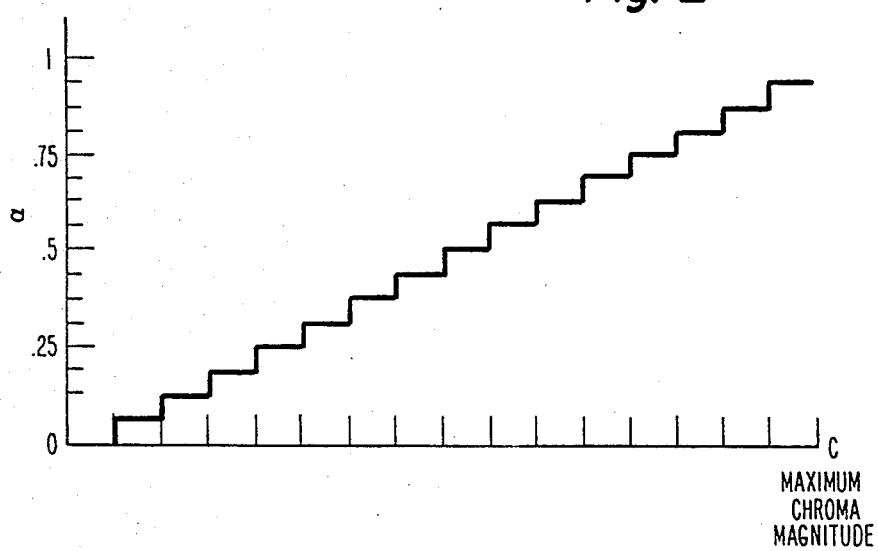
FIG. 2 is a graph of the attenuation factor versus the chrominance signal amplitude which is useful in explaining the operation of the embodiment shown in FIG. 1.

In this arrangement, the four bits applied to the multiplier input port of the sample scaler 49 may represent the values 0 through 15/16. The correspondence between the amplitude of the chrominance samples and the value of the attenuation factor is shown in FIG. 2. The horizontal axis represents the amplitude of the chrominance samples increasing from left to right. This axis is divided into sixteen parts, the leftmost part corresponding to chrominance magnitudes for which the four most significant bits, exclusive of the sign bit, are zeros and the rightmost part to magnitudes for which the four most significant bits, exclusive of the sign bit, are ones. The vertical axis represents the possible values of the attenuation factor. As shown by the graph, the attenuation factor is zero when the four most significant bits of the chrominance magnitude are zero and increases by 1/16 for each increase of 1 in the four most significant bits of the chrominance magnitudes.

Figure 4:
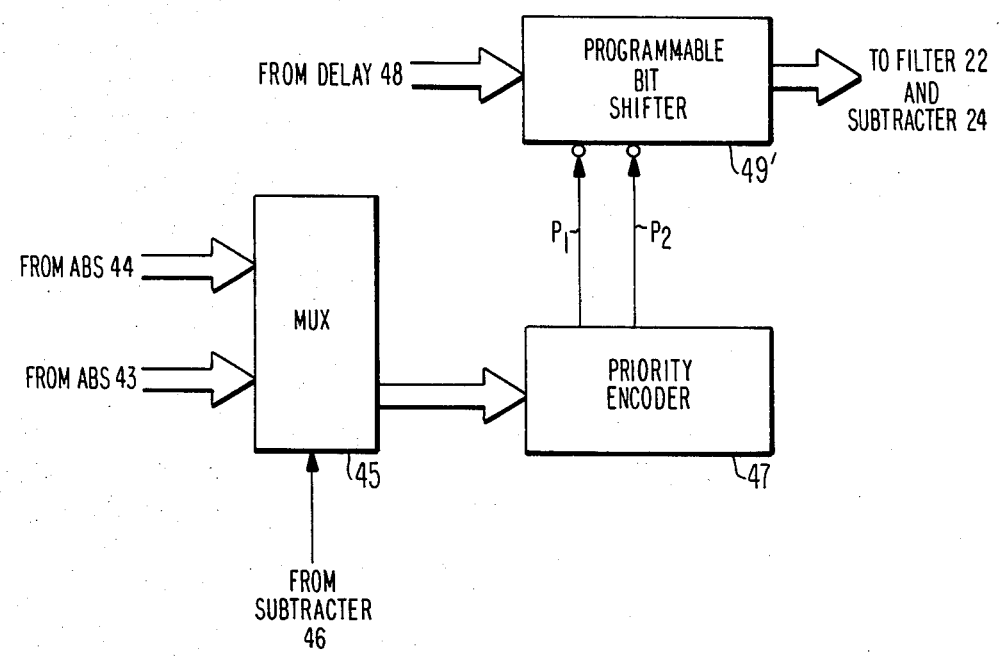
FIG. 4 is a block diagram of an alternative embodiment of the filter system shown in FIG. 1.

FIG. 4 shows an alternative embodiment of a portion of the attenuation network. In this alternative embodiment, four bit samples from multiplexer 45 are applied to a priority encoder 47 which provides a two bit output signal. The signal provided by the priority encoder indicates the position of the most significant one in the four bits from multiplexer 45. Priority encoder 47 is a simple digital circuit which may be built from standard logic elements by one skilled in the art. The two bit digital signal from priority encoder 47 is applied to the control input of an attenuator 49' which in this embodiment is a programmable bit shifter. The data input port of shifter 49' is coupled to receive the chrominance samples from delay element 48 and the output port of shifter 49' is coupled to provide scaled chrominance samples to low pass filter 22 and subtracter 24. Programmable bit shifter 49' may, for example, be similar to the one described in U.S. Pat. No. 4,383,304 entitled "Programmable Bit Shift Circuit". Shifter 49' attenuates the samples provided to its data input port by a factor of 1, ½, ¼, or ⅛ by shifting these samples to the right by 0, 1, 2 or 3 bit positions respectively. The number of bit positions to be shifted is determined by the signal applied to the control input port of programmable bit shifter 49. In the present embodiment, shifter 49 is responsive to the logical complement of the signals generated by priority encoder 47. The following table illustrates the correspondence between chrominance amplitude, the priority encoder output signals P1 and P2, and the attenuation factor applied by shifter 49'.

TABLE 1

| Chrominance Magnitude | P1 | P2 | $\overline{P1}$ | $\overline{P2}$ | Attenuation Factor |
|---|---|---|---|---|---|
| 000XXXXX | 0 | 0 | 1 | 1 | ⅛ |
| 001XXXXX | 0 | 1 | 1 | 0 | ¼ |
| 01XXXXXX | 1 | 0 | 0 | 1 | ½ |

TABLE 1-continued

| Chrominance Magnitude | P1 | P2 | $\overline{P1}$ | $\overline{P2}$ | Attenuation Factor |
|---|---|---|---|---|---|
| 1XXXXXXX | 1 | 1 | 0 | 0 | 1 |

The embodiments described above show open loop implementations of the present invention, since the attenuation factor is not developed from the filtered signal. Closed loop implementations are also contemplated. For example, the four most significant bits of the chrominance amplitude signal developed by the automatic chrominance control circuitry (not shown) or the chrominance overload detection circuitry (not shown) of the television receiver may be used as an attenuation factor. This factor may be applied to sample scaler 49 or to the combination of priority encoder 47 and programmable shifter 49'.

Samples that have been conditioned by the frequency characteristic of the adaptive filtering system are available at the output port of adder 26. These samples are applied to one of the two input ports of adder 30 and to the subtrahend input port of subtracter 32. Luminance samples from output port Y of comb filter 12 are coupled to the second input port adder 30 via delay element 28. Delay element 28 compensates for the processing time through the filtering system described above. Adder 30 restores the vertical detail information extracted from the combined chrominance signals to the combed luminance signals.

Combed chrominance samples from the C output port of comb filter 12 are coupled to the minuend input port of subtracter 32 via delay element 31. Delay element 31 provides sufficient delay so that the samples applied to the minuend input port of subtracter 32 correspond to the filtered samples applied to its subtrahend input port. Subtracter 32 removes vertical detail information from the comb filtered chrominance signal.

When the magnitude of the chrominance signal components of the composite video signals applied to the filtering system is relatively low, the vertical detail information provided by adder 26 has a relatively wide bandwidth. When this vertical detail signal is added to the luminance signal in adder 30, the vertical resolution of the resultant luminance signal is relatively large. Conversely, when the wide bandwidth vertical detail signal is subtracted from the chrominance signal in subtracter 32, the bandwidth of the resultant chrominance signal is relatively narrow.

However, when the magnitude of the chrominance signal component of the composite video is relatively large, these conditions are reversed. The vertical detail signal from adder 26 has a relatively narrow bandwidth, the luminance signal provided by adder 30 has reduced vertical resolution, and the chrominance signal provided by subtracter 32 has a wider bandwidth. This adaptive control of the vertical detail bandwidth tends to subjectively improve the image reproduced on display device of the color television receiver (not shown).

While the present embodiment uses two low pass filters to obtain an adaptive low pass response, it is contemplated that the invention may be practiced using any combination of low pass, band pass or high pass filters. Moreover, the invention is not limited to using the amplitude of a component of the input signal to control the shape of the frequency characteristic of adaptive filter system. It is contemplated that the frequency composition of a component or the relative amplitude or frequency composition of two or more components may also be used to control the shape of the characteristic.

What is claimed is:

1. Apparatus for processing a composite signal having a first signal component, occupying a first band of frequencies, and a second signal component, occupying a second band of frequencies, including a filtering system comprising:

a first filter responsive to said composite signal and having a predetermined frequency response characteristic for passing signals occupying said first band of frequencies to the relative exclusion of signals occupying said second band of frequencies;

control means coupled to receive said composite signal and responsive to a predetermined band of frequencies of at least one of said first and second signal components, for developing a variable control signal that is proportional to the magnitude of at least one of said signal components;

signal splitting means coupled to said first filter and having first and second output terminals for providing respective signals at said first and second output terminals which are mutually supplementary scaled replicas of the signals provided by said first filter, the amplitudes of said respective scaled replica signals being in a ratio porportional to the instantaneous value of said control signal;

a second filter coupled to the first output terminal of said signal splitting means and having a frequency response characteristic substantially equal to said predetermined frequency response characteristic for passing signals occupying said first band of frequencies to the relative exclusion of signals occupying said second band of frequencies; and signal combining means coupled to said second filter and to the second output terminal of said signal splitting means for combining the respective signals provided thereby to produce a filtered output signal.

2. Apparatus for processing a composite signal having a first signal component, occupying a first band of frequencies and a second signal component, occupying a second band of frequencies, including a filtering system comprising:

a first filter responsive to said composite signal for passing signals occupying said first band of frequencies to the relative exclusion of signals occupying said second band of frequencies;

control means coupled to receive said composite signal and responsive to a predetermined band of frequencies of at least one of said first and second signal components, for developing a control signal representing the magnitude of at least one of said signal components;

attenuating means coupled to said first filter and responsive to said control signal for providing a replica of the signal provided by said first filter reduced in amplitude by an amount proportional to the magnitude of said control signal;

subtracting means coupled to said first filter and to said attenuating means for providing a signal proportional to the difference between the signal provided by said first filter and the signal provided by said attenuating means;

a second filter coupled to said attenuating means and responsive to the signals provided thereby for passing signals occupying said band of frequencies to the relative exclusion of signals occupying said second band of frequencies; and signal combining means coupled to said second filter and to said subtracting means for combining the respective signals provided thereby to produce a filtered output signal.

3. The apparatus set forth in claim 2 wherein said control means comprises:

a third filter for passing the signals occupying the predetermined band of frequencies of at least one of said first and second signal components; and signal processing means coupled to said third filter for developing said control signal representing the the amplitude of the signals provided by said third filter.

4. The apparatus set forth in claim 2 wherein the frequency characteristic of said second filter is substantially the same as the frequency characteristic of said first filter.

5. In a video signal processing system having a source of comb filtered chrominance signals which include relatively low frequency luminance signal components and relatively high frequency chrominance signal components including two quadrature phase related color difference signal components, apparatus comprising:

a first low-pass filter coupled to said source for providing the luminance signal components of said comb filtered chrominance signals to the relative exclusion of said chrominance signal components;

control means coupled to said source and responsive to the chrominance signal components of said comb filtered chrominance signals for developing a control signal proportional to the magnitude of said chrominance signal components;

signal splitting means coupled to said first filter and having first and second output terminals, said signal splitting means providing signals at its first and second output terminals which are mutually supplementary scaled replicas of the signals provided by said first filter, the amplitudes of said scaled replicas being in a ratio proportional to the instantaneous value of said control signal;

a second low-pass filter coupled to the first output terminal of said signal splitting means for further attenuating the chrominance signal components relative to the luminance signal components of the signal provided by said signal splitting means; and signal combining means coupled to said second filter and to the second output terminal of said signal splitting means for adding the signals provided thereby to produce a filtered output signal.

6. The apparatus set forth in claim 5 wherein said signal splitting means comprises:

attenuating means coupled to said first filter and responsive to said control signal for providing, at said first output terminal, a replica of the signal provided by said first filter reduced in amplitude by an amount proportional to the magnitude of said control signal; and subtracting means coupled to said first filter and to said attenuating means for providing, at said second output terminal, a signal proportional to the difference between the signal provided by said first filter and the signal provided by said attenuating means.

7. The apparatus set forth in claim 6 wherein said control means comprises:

a high-pass filter for providing the chrominance signal components to the relative exclusion of the luminance signal components of said comb filtered chrominance signals;

means coupled to said high-pass filter for separating the two color difference signal components from said chrominance signal components; and means responsive to said two color difference signal components for providing a control signal proportional to the greater of the instantaneous magnitude values of said two color difference signal components.

8. The apparatus set forth in claim 6 wherein the frequency characteristic of said first low-pass filter is substantially the same as the frequency characteristic of said second low-pass filter.

9. In a digital television receiver including a source of samples representing composite video signals which have luminance signal and chrominance signal components including two quadrature phase related color difference signal components, and a comb filter coupled to said source for providing samples representing a comb filtered luminance signal and samples representing a comb filtered chrominance signal in response to said composite video samples, said comb filtered chrominance samples including said chrominance signal components and relatively low frequency luminance signal components, apparatus comprising:

a first low-pass filter responsive to said comb filtered chrominance samples for providing samples representing the low frequency luminance signal components thereof to the relative exclusion of said chrominance signal components;

control means responsive to said comb filtered chrominance samples for developing a control signal proportional to the magnitude of said chrominance signal components;

signal splitting means coupled to said first filter and having first and second output terminals, said signal splitting means providing signals at its first and second output terminals which are mutually supplementary scaled replicas of the signals provided by said first filter, the amplitudes of said scaled replicas being a ratio proportional to the value of said control signal;

a second low-pass filter coupled to the first output terminal of said signal splitting means for further attenuating the chrominance signal components relative to the luminance signal components of the samples provided by said signal splitting means;

signal combining means coupled to said second filter and to the second output terminal of said signal splitting means for adding the samples provided thereby to produce samples representing a filtered output signal.

10. The apparatus set forth in claim 9, further comprising:

means coupled to said signal combining means and to said comb filter for adding the samples provided by said signal combining means to the comb filtered luminance samples provided by said comb filter to produce samples representing the luminance signal components of said composite video signals.

11. The apparatus set forth in claim 10, further comprising:

means coupled to said signal combining means and to said comb filter for subtracting the samples provided by said signal combining means from the comb filtered chrominance signals provided by said comb filter to produce samples representing the chrominance signal components of said composite video signals.

12. The apparatus set forth in claim 9 wherein said signal splitting means comprises:

attenuating means coupled to said first filter and responsive to said control signal for providing, at said first output terminal, samples representing the samples provided by said first filter reduced in amplitude by an amount proportional to the magnitude of said control signal; and subtracting means coupled to said first filter and to said attenuating means for providing, at said second output terminal, samples proportional to the difference between the samples provided by said first filter and the samples provided by said attenuating means.

13. The apparatus set forth in claim 9 wherein said control means comprises:

a high-pass filter for providing samples representing the chrominance signal components to the relative exclusion of the luminance signal components of said comb filtered chrominance samples;

means coupled to said high-pass filter for providing separate sequences of samples each representing a respectively different one of the two color difference signal components of said chrominance samples; and means responsive to said two color difference signal sample sequences for providing a control signal proportional to the greater of the instantaneous magnitude values of said two color difference signal samples.

14. The apparatus set forth in claim 9 wherein the frequency characteristic of said first low-pass filter is substantially the same as the frequency characteristic of said second low-pass filter.

* * * * *